(12) United States Patent
Wu

(10) Patent No.: US 10,686,454 B2
(45) Date of Patent: Jun. 16, 2020

(54) CLOCK GENERATOR CIRCUIT AND CLOCK GENERATING METHOD

(71) Applicant: M31 TECHNOLOGY CORPORATION, Zhubei, Hsinchu County (TW)

(72) Inventor: Ming-Ting Wu, Hsinchu (TW)

(73) Assignee: M31 TECHNOLOGY CORPORATION, Zhubei (TW)

(*) Notice: Subject to any disclaimer, the term of this patent is extended or adjusted under 35 U.S.C. 154(b) by 0 days.

(21) Appl. No.: 16/268,625

(22) Filed: Feb. 6, 2019

(65) Prior Publication Data

US 2019/0372575 A1 Dec. 5, 2019

(30) Foreign Application Priority Data

Jun. 5, 2018 (TW) .............................. 107119377 A

(51) Int. Cl.
*H03L 7/099* (2006.01)
*H03L 7/089* (2006.01)
*H03F 3/45* (2006.01)
*H03H 7/06* (2006.01)
*H03L 7/18* (2006.01)
(Continued)

(52) U.S. Cl.
CPC .......... *H03L 7/099* (2013.01); *H03F 3/45188* (2013.01); *H03H 7/06* (2013.01); *H03L 7/0893* (2013.01); *H03L 7/0895* (2013.01); *H03F 2200/129* (2013.01); *H03F 2200/144* (2013.01); *H03F 2200/165* (2013.01); *H03F 2203/45116* (2013.01); *H03F 2203/45512* (2013.01); *H03F 2203/45526* (2013.01); *H03L 7/0807* (2013.01); *H03L 7/087* (2013.01); *H03L 7/18* (2013.01); *H03L 2207/06* (2013.01)

(58) Field of Classification Search
None
See application file for complete search history.

(56) References Cited

U.S. PATENT DOCUMENTS 5,600,272 A * 2/1997 Rogers .................. H03L 7/0891
327/157
7,148,757 B2 12/2006 Chiu
(Continued)

OTHER PUBLICATIONS

Search Report appended to an Office Action issued to Taiwanese counterpart application No. 107119377 by the TIPO dated Dec. 22, 2018, with an English translation thereof.

*Primary Examiner* — Cassandra F Cox
(74) *Attorney, Agent, or Firm* — Hamre, Schumann, Mueller & Larson, P.C.

(57) ABSTRACT

A clock generator circuit includes a charge pump unit, a low-pass filter unit, a current-controlled clock generator and a voltage-to-current converter unit. The charge pump unit provides a pump current at an output terminal thereof. The low-pass filter unit is coupled to the output terminal of the charge pump unit, and develops a control voltage at an output terminal thereof based on the pump current. The voltage-to-current converter unit is coupled to the output terminal of the low-pass filter unit, the current-controlled clock generator and the charge pump unit, and provides a control current to the current-controlled clock generator. Each of the low-pass filter unit and the voltage-to-current converter unit includes a resistive element.

12 Claims, 13 Drawing Sheets

(51) Int. Cl.
*H03L 7/08* (2006.01)
*H03L 7/087* (2006.01)

(56) References Cited

U.S. PATENT DOCUMENTS

| | | | |
|---|---|---|---|
| 7,203,149 B1* | 4/2007 | Sano | G11B 20/10009 |
| | | | 331/11 |
| 10,333,530 B1* | 6/2019 | Katsuragi | H03L 7/097 |
| 2003/0076140 A1* | 4/2003 | Asano | H03L 7/10 |
| | | | 327/157 |
| 2008/0136474 A1* | 6/2008 | Okada | H03L 7/0805 |
| | | | 327/156 |
| 2008/0164950 A1* | 7/2008 | Kelkar | H03L 7/0995 |
| | | | 331/16 |
| 2009/0115461 A1* | 5/2009 | Okada | H03F 3/45179 |
| | | | 327/103 |
| 2011/0080145 A1* | 4/2011 | Tsukuda | H03L 1/00 |
| | | | 323/234 |
| 2011/0234276 A1* | 9/2011 | Kaneko | H03L 7/099 |
| | | | 327/157 |
| 2017/0077933 A1* | 3/2017 | Zhang | H03L 7/0807 |

\* cited by examiner

CLOCK GENERATOR CIRCUIT AND CLOCK GENERATING METHOD

CROSS-REFERENCE TO RELATED APPLICATION

This application claims priority of Taiwanese Patent Application No. 107119377, filed on Jun. 5, 2018.

FIELD

The disclosure relates to clock generation, and more particularly to a clock generator circuit and a clock generating method that can cause a loop bandwidth related to the clock generator circuit to be independent of process, voltage and temperature (PVT) variations.

BACKGROUND

Clock generator devices (such as phase-locked loops (PLLs), frequency-locked loops (FLLs), clock and data recovery (CDR) devices, delay-locked loops (DLLs), etc.) have been widely used in integrated circuits of various fields. When designing a clock generator device, a loop bandwidth thereof is an important factor that will influence various performances thereof (such as stability, lock speed, noise, etc.). The loop bandwidth is generally designed to be within a range from one hundredth to one tenth of a frequency of an input clock signal received by the clock generator device. For each of various application specifications, a designer must redesign various loop parameters of the clock generator device to meet the design requirement of the loop bandwidth. Process, voltage and temperature (PVT) variations will occur during manufacture and operation of an integrated circuit that includes the clock generator device. As a consequence, the loop bandwidth will deviate from the designed value to undermine the performances of the clock generator device. Even worse, the loop bandwidth may deviate beyond the aforesaid range to make the clock generator device unstable and inoperable.

SUMMARY

Therefore, an object of the disclosure is to provide a clock generator circuit and a clock generating method that can cause a loop bandwidth related to the clock generator circuit to be independent of process, voltage and temperature (PVT) variations.

According to an aspect of the disclosure, the clock generator circuit includes a charge pump unit, a low-pass filter unit, a current-controlled clock generator and a voltage-to-current converter unit. The charge pump unit provides a pump current at an output terminal thereof. The low-pass filter unit is coupled to the output terminal of the charge pump unit, and develops a control voltage at an output terminal thereof based on the pump current. The voltage-to-current converter unit is coupled to the output terminal of the low-pass filter unit, the current-controlled clock generator and the charge pump unit, and provides a control current to the current-controlled clock generator. The low-pass filter unit includes a first resistive element, and the voltage-to-current converter unit includes a second resistive element.

According to another aspect of the disclosure, the clock generating method is to be implemented by a clock generator circuit that includes a charge pump unit, a low-pass filter unit, a voltage-to-current converter unit and a current-controlled clock generator. The low-pass filter unit is coupled to an output terminal of the charge pump unit, and includes a first resistive element. The voltage-to-current converter unit is coupled to the charge pump unit and an output terminal of the low-pass filter unit, and includes a second resistive element. The current-controlled clock generator is coupled to the voltage-to-current converter unit. The clock generating method includes: by the charge pump unit, receiving a difference signal, and providing a pump current at the output terminal thereof; developing, by the low-pass filter unit, a control voltage at the output terminal thereof based on the pump current; and providing a control current by the voltage-to-current converter unit.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
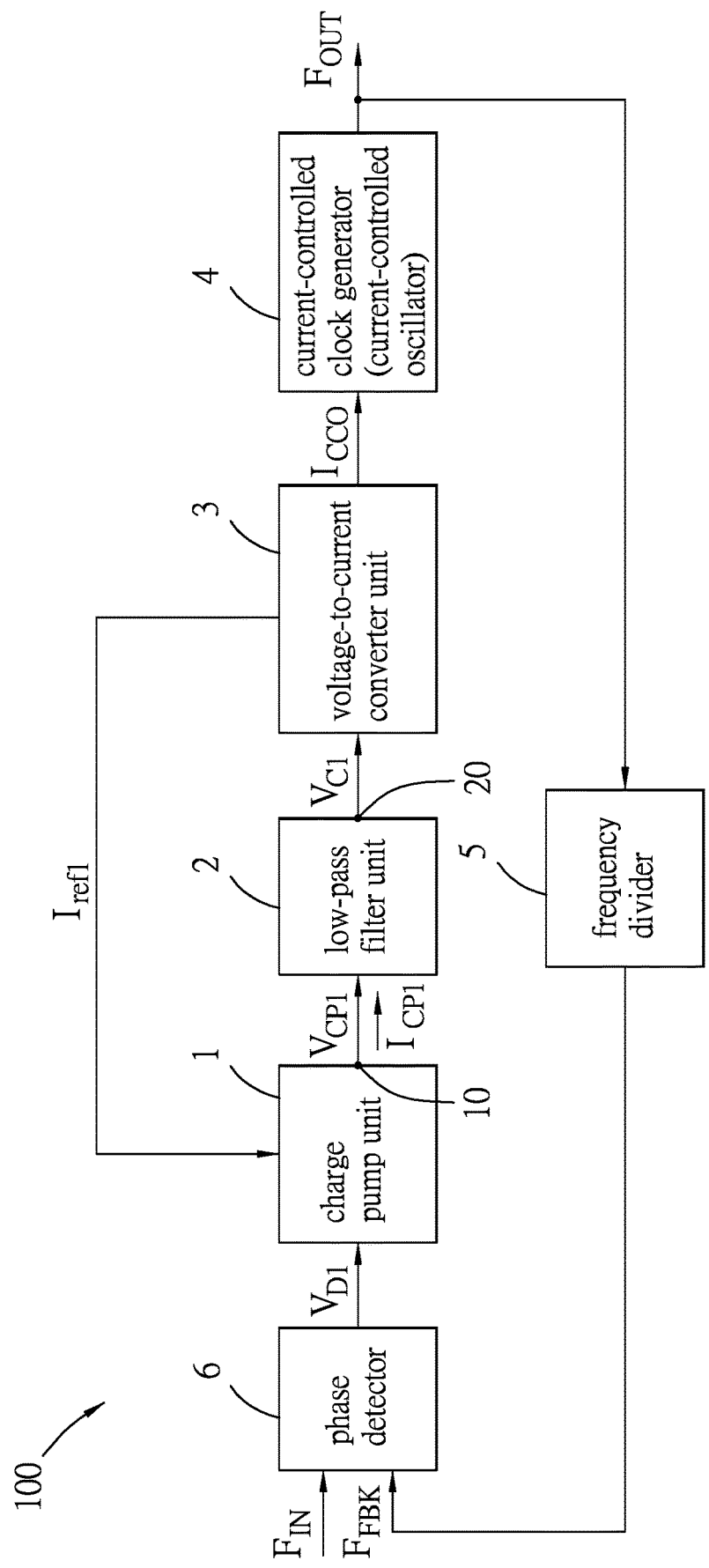
FIG. 1 is a block diagram illustrating a first use of a clock generator circuit according to the disclosure in a phase-locked loop.

Before the disclosure is described in greater detail, it should be noted that where considered appropriate, reference numerals or terminal portions of reference numerals have been repeated among the figures to indicate corresponding or analogous elements, which may optionally have similar characteristics.

1st Embodiment

Referring to FIG. 1, a first embodiment of a clock generator circuit 100 according to the disclosure includes a charge pump unit 1, a low-pass filter unit 2, a voltage-to-current converter unit 3 and a current-controlled clock generator 4. In this embodiment, the current-controlled clock generator 4 is a current-controlled oscillator, and the clock generator circuit 100 cooperates with a phase detector 6 and a frequency divider 5 to form a phase-locked loop (PLL).

The frequency divider 5 receives an output clock signal ($F_{OUT}$), and generates a divided clock signal ($F_{FBK}$). A ratio of a frequency of the output clock signal ($F_{OUT}$) to a frequency of the divided clock signal ($F_{FBK}$) is predetermined, and may be a positive integer or a positive fraction. The phase detector 6 receives an input clock signal ($F_{IN}$) (i.e., a reference clock signal), and is coupled to the frequency divider 5 for receiving the divided clock signal ($F_{FBK}$) therefrom. The phase detector 6 compares a phase of the input clock signal ($F_{IN}$) and a phase of the divided clock signal ($F_{FBK}$) to generate a first difference signal ($V_{D1}$) related to a phase difference between the input clock signal ($F_{IN}$) and the divided clock signal ($F_{FBK}$).

Figure 2:
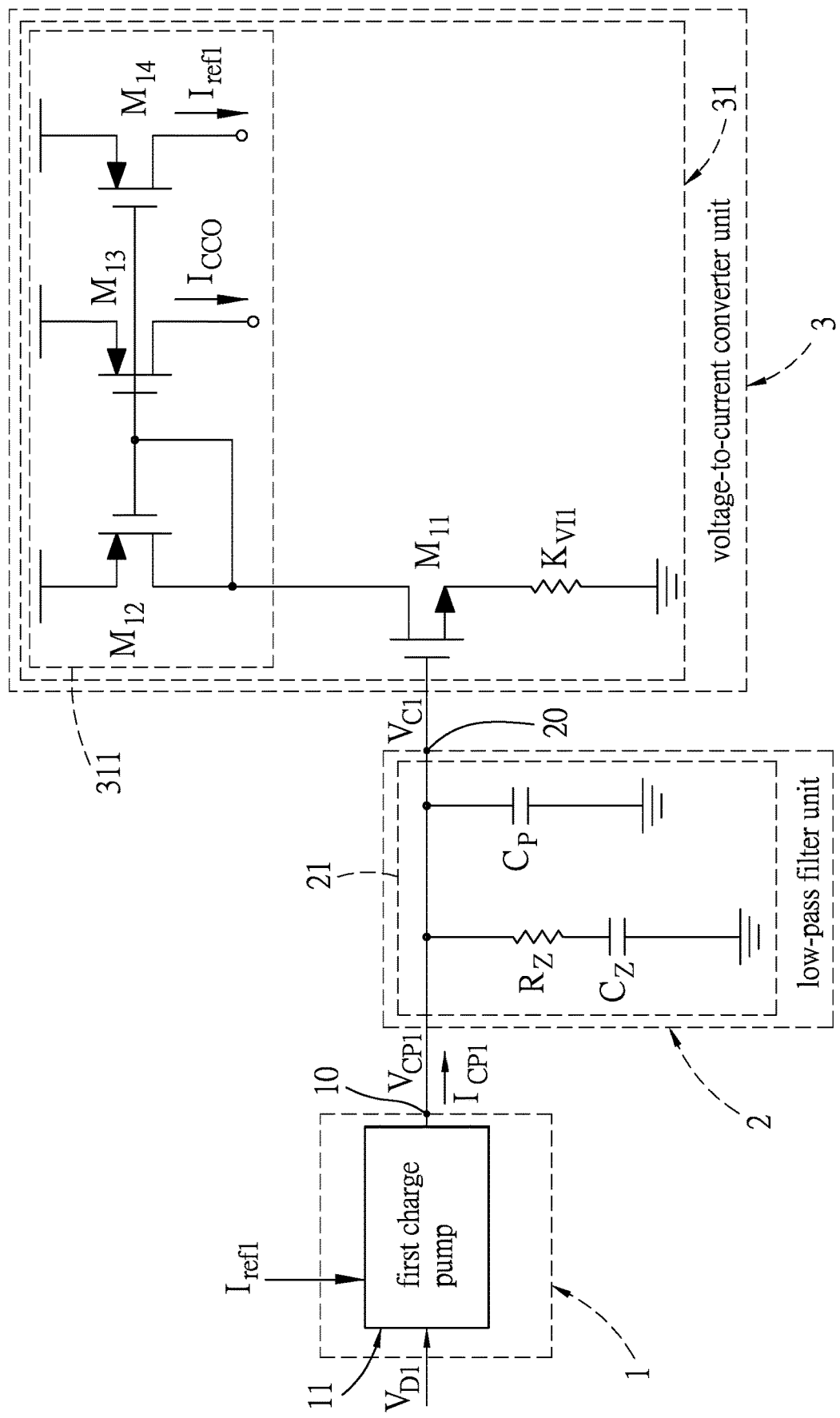
FIG. 2 is a circuit block diagram illustrating a first embodiment of the clock generator circuit according to the disclosure.

Referring to FIGS. 1 and 2, the charge pump unit 1 includes a first charge pump 11 and an output terminal 10. The first charge pump 11 is coupled to the phase detector 6 for receiving the first difference signal ($V_{D1}$) therefrom, further receives a first reference current ($I_{ref1}$), is further coupled to the output terminal 10, and provides a first pump current ($I_{CP1}$) at the output terminal 10 based on the first difference signal ($V_{D1}$) and the first reference current ($I_{ref1}$). A ratio of a magnitude of the first pump current ($I_{CP1}$) to a magnitude of the first reference current ($I_{ref1}$) is constant. The low-pass filter unit 2 includes a first filter 21 and an output terminal 20. The first filter 21 is coupled to the output terminals 10, 20, receives the first pump current ($I_{CP1}$) from the output terminal 10, and develops a first control voltage ($V_{C1}$) at the output terminal 20 based on the first pump current ($I_{CP1}$). The voltage-to-current converter unit 3 is coupled to the output terminal 20, the current-controlled clock generator 4 and the first charge pump 11, provides a control current ($I_{CCO}$) to the current-controlled clock generator 4, and provides the first reference current ($I_{ref1}$) to the first charge pump 11.

As shown in FIG. 2, in this embodiment, the output terminal 20 is coupled to the output terminal 10, and the first filter 21 includes a first resistive element ($R_Z$), a first capacitive element ($C_Z$) and a second capacitive element ($C_P$). The first resistive element ($R_Z$) has a resistance of a first resistance value. The first resistive element ($R_Z$) and the first capacitive element ($C_Z$) are coupled in series between the output terminal 20 and ground. The second capacitive element ($C_P$) is coupled in parallel to the series connection of the first resistive element ($R_Z$) and the first capacitive element ($C_Z$).

It should be noted that, in this embodiment, since the output terminal 20 is coupled to the output terminal 10, a first output voltage ($V_{CP1}$) at the output terminal 10 is equal to the first control voltage ($V_{C1}$) at the output terminal 20 in magnitude. However, in other embodiments, the output terminal 20 may be not coupled to the output terminal 10 because, for example, the first filter 21 has a different configuration, so the first output voltage ($V_{CP1}$) at the output terminal 10 may be different from the first control voltage ($V_{C1}$) at the output terminal 20 in magnitude.

As shown in FIG. 2, in this embodiment, the voltage-to-current converter unit 3 includes a first voltage-to-current converter 31. The first voltage-to-current converter 31 is coupled to the output terminal 20, the current-controlled clock generator 4 (see FIG. 1) and the first charge pump 11, receives the first control voltage ($V_{C1}$) from the output terminal 20, and generates the control current ($I_{CCO}$) and the first reference current ($I_{ref1}$) for receipt respectively by the current-controlled clock generator 4 and the first charge pump 11.

The first voltage-to-current converter 31 includes a first transistor ($M_{11}$), a second resistive element ($K_{VT1}$) and a current mirror 311. The first transistor ($M_{11}$) (e.g., an N-channel metal oxide semiconductor field effect transistor (nMOSFET)) has a drain terminal, a source terminal, and a gate terminal that is coupled to the output terminal 20 for receiving the first control voltage ($V_{C1}$) therefrom. The second resistive element ($K_{VT1}$) is coupled between the source terminal of the first transistor ($M_{11}$) and ground, and has a resistance of a second resistance value. The current mirror 311 is coupled to the drain terminal of the first transistor ($M_{11}$), the current-controlled clock generator 4 and the first charge pump 11, and generates, based on a current flowing through the first transistor ($M_{11}$), the control current ($I_{CCO}$) and the first reference current ($I_{ref1}$) for receipt respectively by the current-controlled clock generator 4 and the first charge pump 11.

In an example, the current mirror 311 includes a second transistor ($M_{12}$), a third transistor ($M_{13}$) and a fourth transistor ($M_{14}$). The second transistor ($M_{12}$) (e.g., a P-channel metal oxide semiconductor field effect transistor (pMOSFET)) has a drain terminal that is coupled to the drain terminal of the first transistor ($M_{11}$), a source terminal that receives a supply voltage, and a gate terminal that is coupled to the drain terminal thereof. The third transistor ($M_{13}$) (e.g., a pMOSFET) has a drain terminal that is coupled to the current-controlled clock generator 4 and that provides the control current ($I_{CCO}$), a source terminal that receives the supply voltage, and a gate terminal that is coupled to the gate terminal of the second transistor ($M_{12}$). The fourth transistor ($M_{14}$) (e.g., a pMOSFET) has a drain terminal that is coupled to the first charge pump 11 and that provides the first reference current ($I_{ref1}$), a source terminal that receives the supply voltage, and a gate terminal that is coupled to the gate terminal of the second transistor ($M_{12}$).

Therefore, a magnitude of the control current ($I_{CCO}$) and the magnitude of the first reference current ($I_{ref1}$) are both determined based on a magnitude of the first control voltage ($V_{C1}$) and the resistance of the second resistive element ($K_{VT1}$), and a ratio of the magnitude of the first reference current ($I_{ref1}$) to the magnitude of the control current ($I_{CCO}$) can be designed to be constant. In detail, by proper layout of the second to fourth transistors ($M_{12}$-$M_{14}$) (e.g., the second to fourth transistors ($M_{12}$-$M_{14}$) are formed using a transistor unit with predetermined dimensions), the ratio of the magnitude of the first reference current ($I_{ref1}$) to the magnitude of the control current ($I_{CCO}$) can be independent of process, voltage and temperature (PVT) variations of the clock generator circuit 100 of this embodiment, and can be constant.

In this embodiment, the first and second resistive elements ($R_Z$, $K_{VT1}$) are active resistors of the same type or passive resistors of the same type, and the resistances thereof are connected with a loop bandwidth of the PLL. By proper layout of the first and second resistive elements ($R_Z$, $K_{VT1}$) (e.g., the first and second resistive elements ($R_Z$, $K_{VT1}$) are formed using a resistor unit with predetermined dimensions), a ratio of the resistance of the first resistive element ($R_Z$) to the resistance of the second resistive element ($K_{VT1}$) can be independent of the PVT variations of the clock generator circuit 100 of this embodiment, and can be constant.

Although the first transistor ($M_{11}$) is an nMOSFET and each of the second to fourth transistors ($M_{12}$-$M_{14}$) is a pMOSFET in this embodiment, it should be noted that: (a) in another embodiment, the first transistor ($M_{11}$) may be a pMOSFET instead of an nMOSFET, each of the second to fourth transistors ($M_{12}$-$M_{14}$) may be an nMOSFET instead of a pMOSFET, and may be coupled to ground instead of receiving the supply voltage, and the second resistive element ($K_{VT1}$) may receive the supply voltage instead of being coupled to ground; and (b) in yet another embodiment, each of the first to fourth transistors ($M_{11}$-$M_{14}$) may be a transistor other than the MOSFET; but the disclosure is not limited thereto. Moreover, in this embodiment, each of the first and second capacitive elements ($C_Z$, $C_P$) may be a metal-insulator-metal capacitor, or may be implemented using a transistor, but the disclosure is not limited thereto.

The current-controlled clock generator 4 is coupled to the drain terminal of the third transistor ($M_{13}$) for receiving the control current ($I_{CCO}$) therefrom, is coupled further to the frequency divider 5, and generates, based on the control current ($I_{CCO}$), the output clock signal ($F_{OUT}$) for receipt by the frequency divider 5. In an example, the frequency of the output clock signal ($F_{OUT}$) is positively correlated to the magnitude of the control current ($I_{CCO}$). In other words, greater magnitude of the control current ($I_{CCO}$) leads to higher frequency of the output clock signal ($F_{OUT}$).

The bandwidth ($f_{BW}$) of the PLL can be expressed by the following equation:

$$f_{BW} = \frac{i_{CP1} \cdot r_Z \cdot k_{CCO}}{2\pi \cdot N \cdot k_{VI1}} = \qquad \text{Equation 1}$$
$$\frac{r_Z}{k_{VI1}} \cdot \frac{i_{CCO} \cdot k_{CCO}}{M \cdot 2\pi \cdot N} = \frac{r_Z}{k_{VI1}} \cdot \frac{f_{IN}}{2\pi \cdot M} = \beta \cdot \frac{f_{IN}}{2\pi \cdot M},$$

where $i_{CP1}$ denotes the magnitude of the first pump current ($I_{CP1}$), $r_Z$ denotes the resistance of the first resistive element ($R_Z$), $k_{CCO}$ denotes a gain of the current-controlled clock generator 4 (i.e., a ratio of the frequency of the output clock signal ($F_{OUT}$) to the magnitude of the control current ($I_{CCO}$)), N denotes a divisor of the frequency divider 5 (i.e., the ratio of the frequency of the output clock signal ($F_{OUT}$) to the frequency of the divided clock signal ($F_{FBK}$)), $k_{VT1}$ denotes the resistance of the second resistive element ($K_{VT1}$), $i_{CCO}$ denotes the magnitude of the control current ($I_{CCO}$), $f_{IN}$ denotes a frequency of the input clock signal ($F_{IN}$), $$M = \frac{i_{CCO}}{i_{CP1}} \text{ and } \beta = \frac{r_Z}{k_{VI1}}.$$

Since the ratio of the magnitude of the first reference current ($I_{ref1}$) to the magnitude of the control current ($I_{CCO}$) is constant, since the ratio of the magnitude of the first pump current ($I_{CP1}$) to the magnitude of the first reference current ($I_{ref1}$) is constant, and since the ratio of the resistance of the first resistive element ($R_Z$) to the resistance of the second resistive element ($K_{VT1}$) is constant, each of M and β is independent of the PVT variations of the clock generator circuit 100 of this embodiment and is constant, so according to Equation 1, the bandwidth of the PLL is independent of the PVT variations of the clock generator circuit 100 of this embodiment and is constant.

$2^{nd}$ Embodiment

Figure 3:
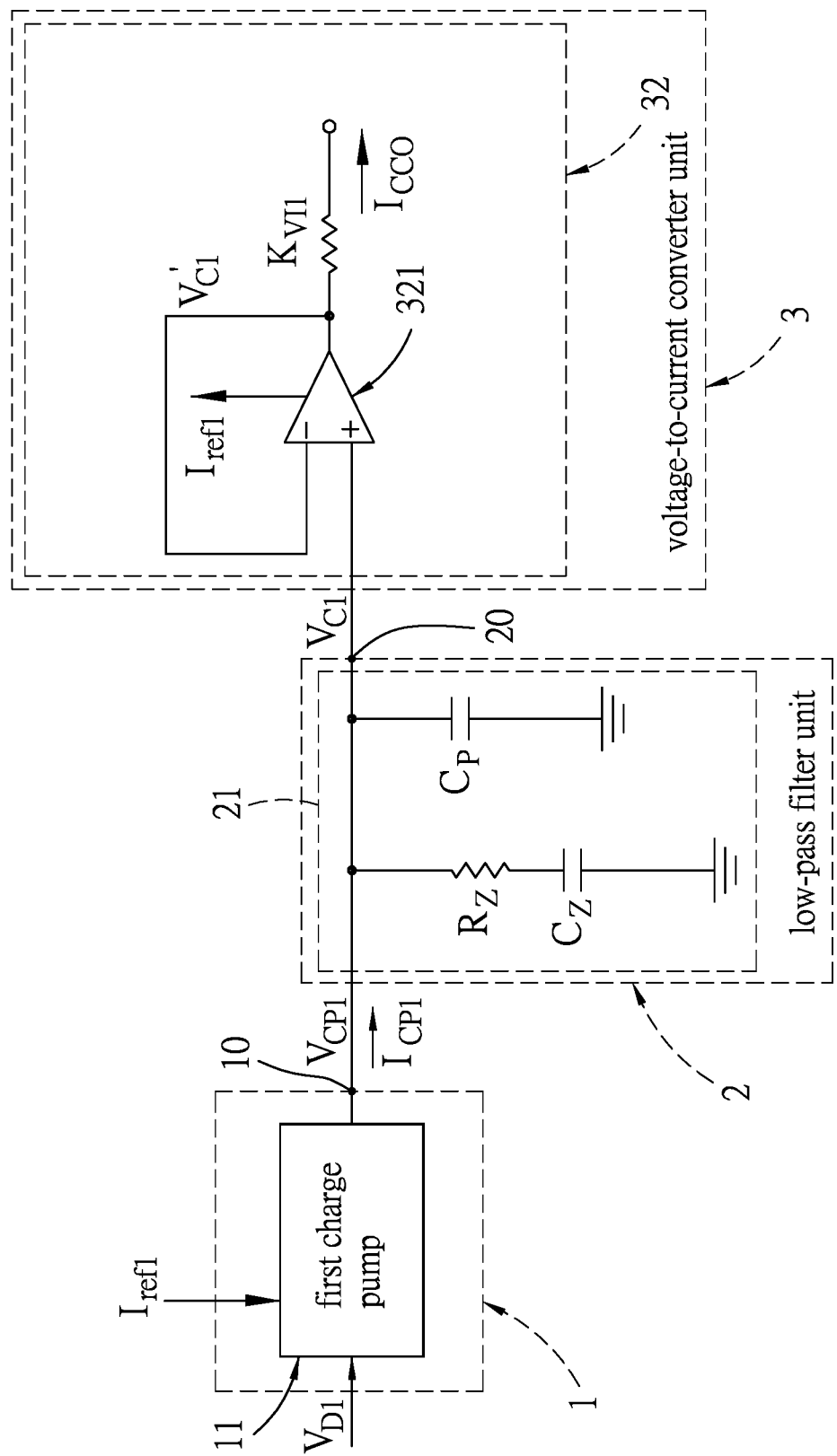
FIG. 3 is a circuit block diagram illustrating a second embodiment of the clock generator circuit according to the disclosure.

Referring to FIGS. 1 and 3, a second embodiment of the clock generator circuit 100 according to the disclosure is derived from the first embodiment, and differs from the first embodiment in the configuration of the voltage-to-current converter unit 3.

In the second embodiment, the voltage-to-current converter unit 3 includes a first voltage-to-current converter 32. The first voltage-to-current converter 32 includes a first operational amplifier 321, and a second resistive element ($K_{VT1}$). The first operational amplifier 321 has a non-inverting input terminal that is coupled to the output terminal 20 for receiving the first control voltage ($V_{C1}$) therefrom, an inverting input terminal, and an output terminal that is coupled to the inverting input terminal thereof. The first operational amplifier 321 is coupled further to the first charge pump 11. The second resistive element ($K_{VT1}$) is coupled between the output terminal of the first operational amplifier 321 and the current-controlled clock generator 4, and has a resistance of the second resistance value. The first operational amplifier 321 serves as a unity gain buffer, so a voltage ($V_{C1}'$) at the output terminal of the first operational amplifier 321 is equal to the first control voltage ($V_{C1}$) in magnitude. The first operational amplifier 321 generates the control current ($I_{CCO}$)) at the output terminal thereof, and generates the first reference current ($I_{ref1}$) for receipt by the first charge pump 11. The control current ($I_{CCO}$) flows to the current-controlled clock generator 4 through the second resistive element ($K_{VT1}$).

Figure 4:
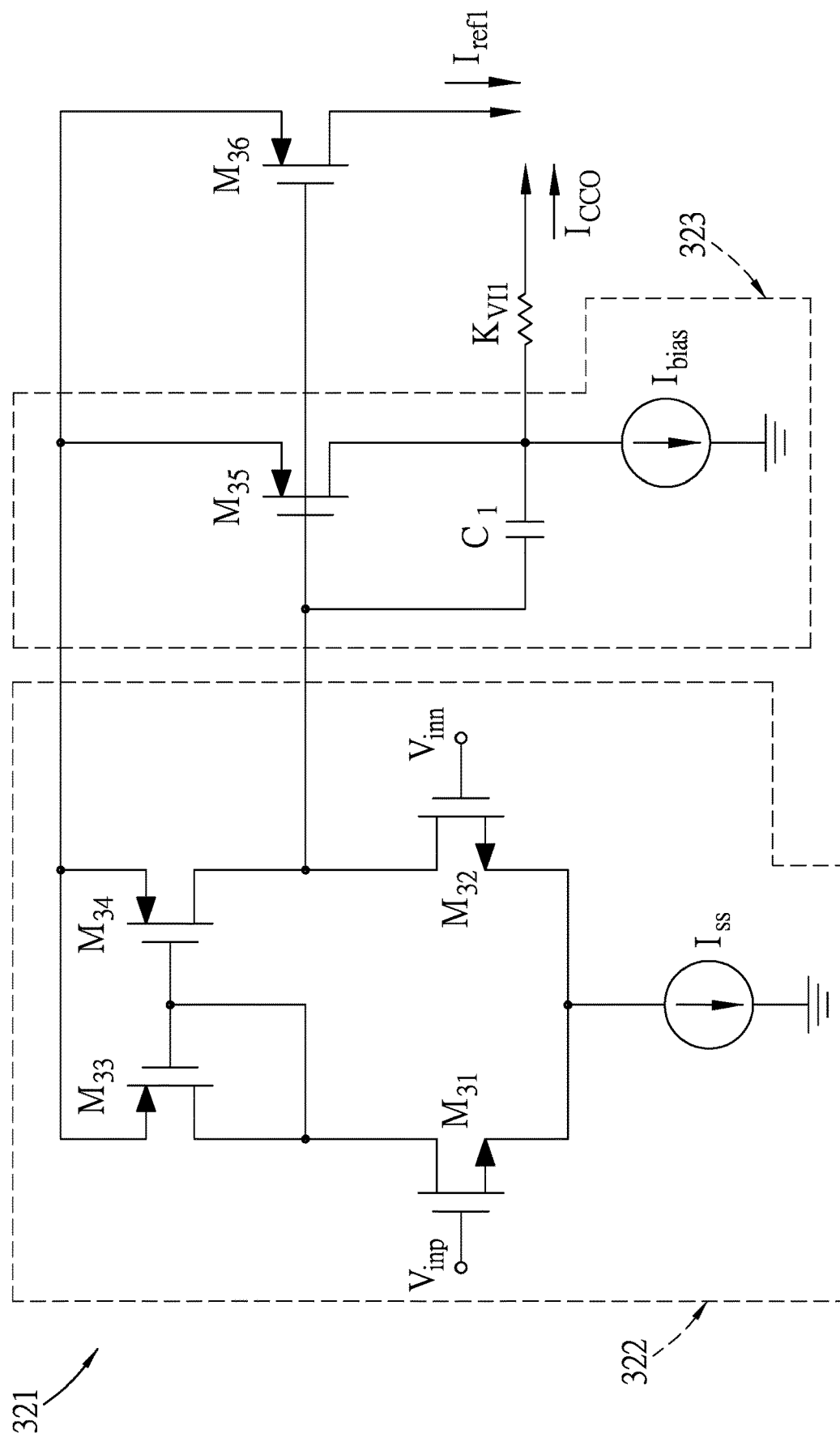
FIG. 4 is a circuit diagram illustrating a first operational amplifier and a second resistive element of the second embodiment.

Referring to FIGS. 1, 3 and 4, in this embodiment, the first operational amplifier 321 is a two-stage operational amplifier, and includes a first stage 322, a second stage 323 and a transistor ($M_{36}$) (e.g., a MOSFET). The first stage 322 is used to provide a high gain, and the second stage 323 is used to provide a high swing. In an example, the first stage 322 includes four transistors ($M_{31}$-$M_{34}$) (e.g., four MOSFETs) and a current source ($I_{SS}$). A gate terminal of the transistor ($M_{31}$) serves as the non-inverting input terminal ($V_{inp}$) of the first operational amplifier 321. A gate terminal of the transistor ($M_{32}$) serves as the inverting input terminal ($V_{inn}$) of the first operational amplifier 321. In addition, the second stage 323 includes a capacitor ($C_1$), a transistor ($M_{35}$) (e.g., a MOSFET) and a current source ($I_{bias}$). A current generated by the transistor ($M_{35}$) is divided into the control current ($I_{CCO}$) and a current flowing through the current source ($I_{bias}$). The first reference current ($I_{ref1}$) is generated by the transistor ($M_{36}$). By designing the control current ($I_{CCO}$) to be far greater than the current flowing through the current source ($I_{bias}$) in magnitude, the current generated by the transistor ($M_{35}$) can be deemed to be equal to the control current ($I_{CCO}$) in magnitude. In addition, by proper layout of the transistors ($M_{35}$, $M_{36}$) (e.g., the transistors ($M_{35}$, $M_{36}$) are formed using a transistor unit with predetermined dimensions), the ratio of the magnitude of the first reference current ($I_{ref1}$) to the magnitude of the control current ($I_{CCO}$) can be independent of the PVT variations of the clock generator circuit 100 of this embodiment, and can be constant.

The loop bandwidth of the PLL including the clock generator circuit 100 of this embodiment is the same as that of the PLL including the clock generator circuit 100 of the first embodiment. In addition, the first and second resistive elements ($R_Z$, $K_{VT1}$) are resistors of the same type. Moreover, other than the two-stage operational amplifier described, the first operational amplifier 321 may simply be an operational amplifier that can provide a high gain and a high swing.

3$^{rd}$ Embodiment

Figure 5:
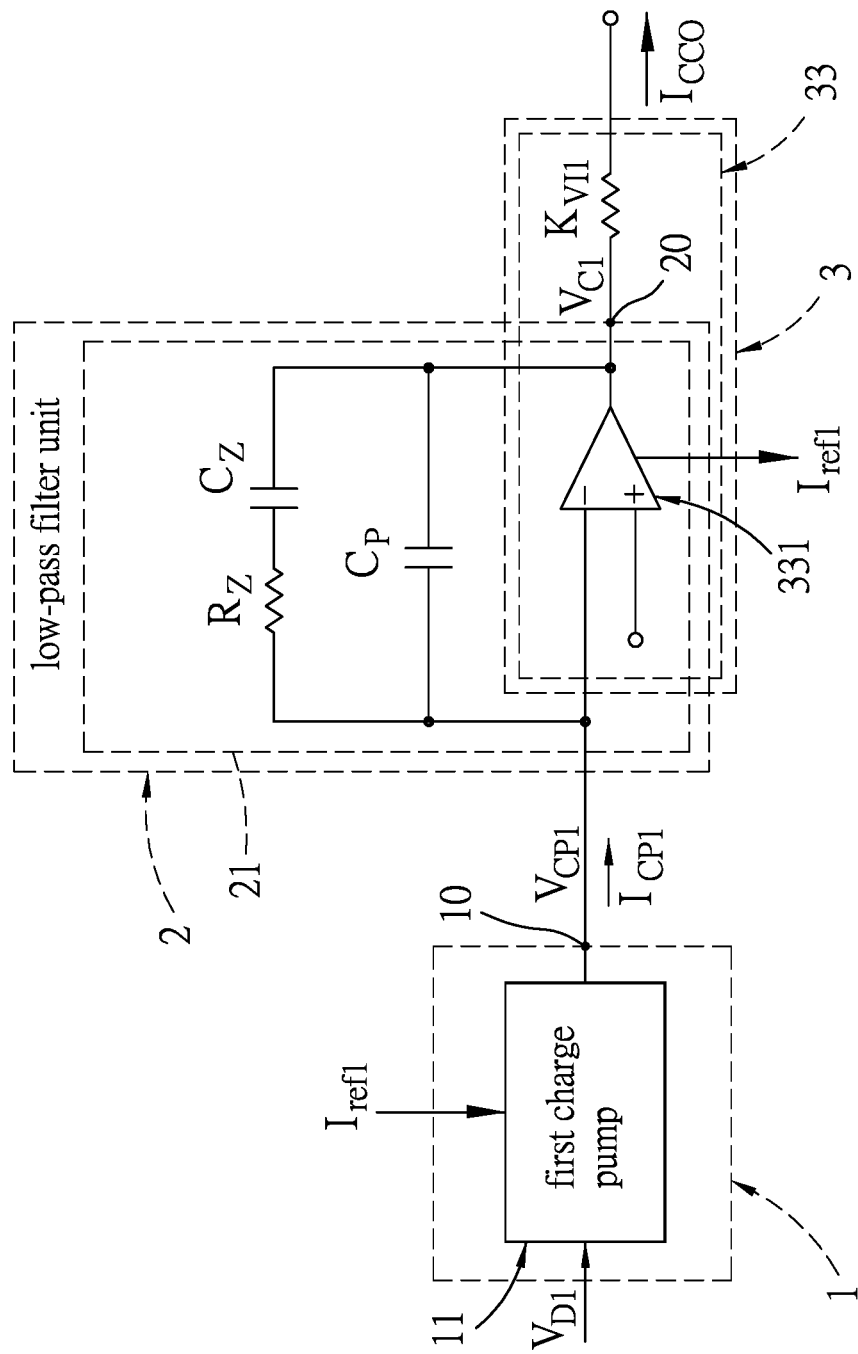
FIG. 5 is a circuit block diagram illustrating a third embodiment of the clock generator circuit according to the disclosure.

Referring to FIGS. 1 and 5, a third embodiment of the clock generator circuit 100 according to the disclosure is derived from the second embodiment, and differs from the second embodiment in that the first resistive element ($R_Z$) and the first and second capacitive elements ($C_Z$, $C_P$) cooperate with a first operational amplifier 331 to develop the first control voltage ($V_{C1}$). The first operational amplifier 331 has a configuration the same as that of the first operational amplifier 321 (see FIG. 3) of the second embodiment. It should be noted that, in other embodiments, the clock generator device 100 may further include another operational amplifier having a configuration the same as that of the first operational amplifier 331, and the first resistive element ($R_Z$) and the first and second capacitive elements ($C_Z$, $C_P$) may cooperate with the another operational amplifier, instead of the first operational amplifier 331, to develop the first control voltage ($V_{C1}$).

In the third embodiment, the output terminal 20 is not coupled to the output terminal 10. The first operational amplifier 331 has a non-inverting input terminal that receives a reference voltage, an inverting input terminal that is coupled to the output terminal 10 for receiving the first output voltage ($V_{CP1}$) therefrom, and an output terminal that is coupled to the output terminal 20. The reference voltage is generally within a ground voltage and the supply voltage, such that the first operational amplifier 331 operates in a predetermined bias condition.

The second resistive element ($K_{VT1}$) is coupled between the output terminal of the first operational amplifier 331 and the current-controlled clock generator 4, and has a resistance of the second resistance. The control current ($I_{CCO}$) is generated by the first operational amplifier 331 at the output terminal thereof, and flows to the current-controlled clock generator 4 through the second resistive element ($K_{VT1}$).

The first resistive element ($R_Z$) and the first capacitive element ($C_Z$) are coupled in series between the output terminals 10, 20, and the second capacitive element ($R_P$) is coupled between the output terminals 10, 20, too.

The loop bandwidth of the PLL including the clock generator circuit 100 of this embodiment is the same as that of the PLL including the clock generator circuit 100 of the first embodiment.

4$^{th}$ Embodiment

Figure 6:
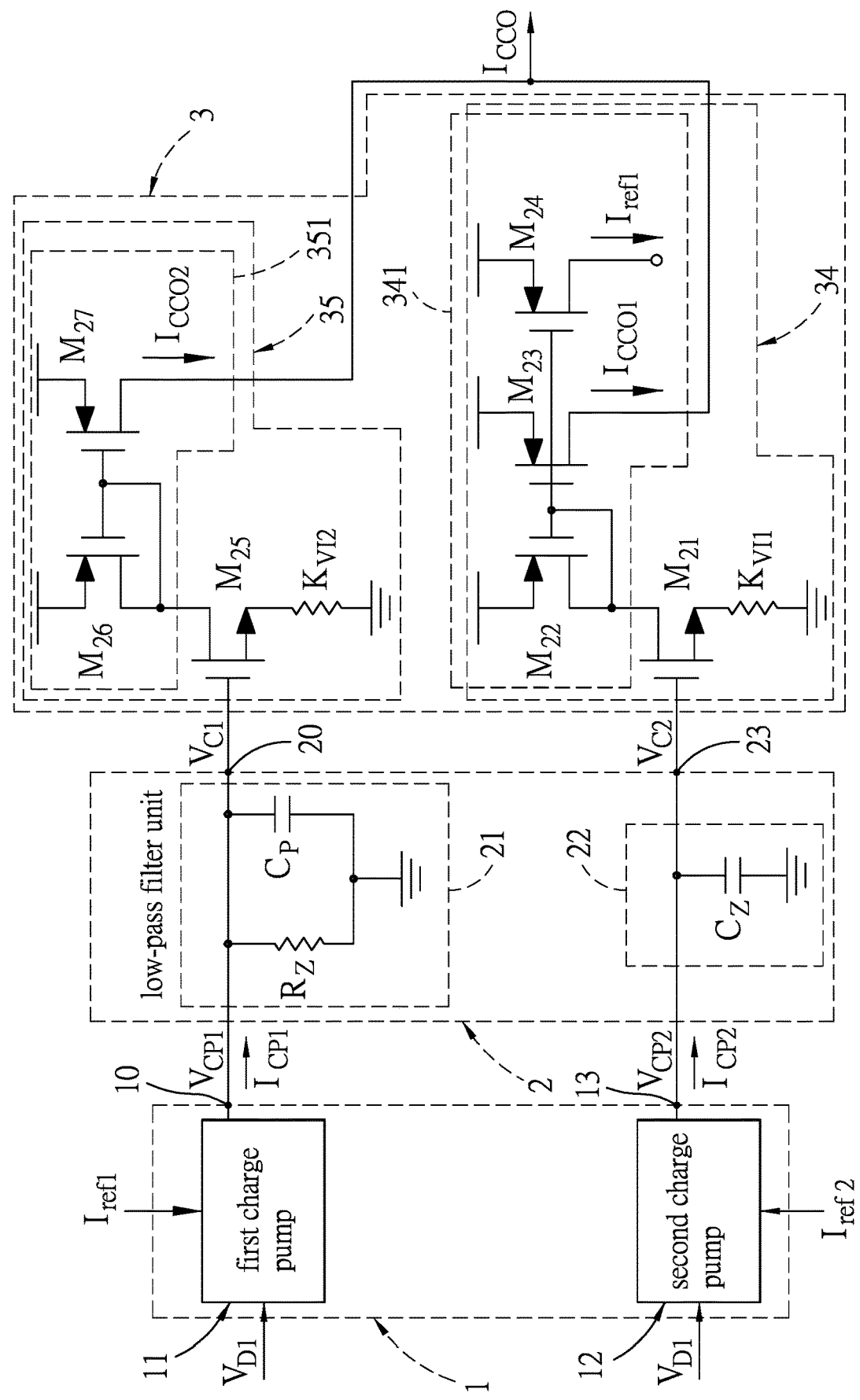
FIG. 6 is a circuit block diagram illustrating a fourth embodiment of the clock generator circuit according to the disclosure.

Referring to FIGS. 1 and 6, a fourth embodiment of the clock generator circuit 100 according to the disclosure is derived from the first embodiment, and differs from the first embodiment in that: (a) the charge pump unit 1 of the fourth embodiment includes not only the first charge pump 11 and the output terminal 10, but also a second charge pump 12 and another output terminal 13; (b) the low-pass filter unit 2 of the fourth embodiment further includes another output terminal 23; (c) the first filter 21 (see FIG. 2) of the first embodiment is divided into a first filter 21 and a second filter 22 of the fourth embodiment that have different configurations, and that respectively develop a first control voltage ($V_{C1}$) and a second control voltage ($V_{C2}$) respectively at the output terminals 20, 23; (d) the voltage-to-current converter unit 3 of the fourth embodiment includes a first voltage-to-current converter 34 and a second voltage-to-current converter 35 that are respectively coupled to the output terminals 23, 20; and (e) the first and second voltage-to-current converters 34, 35 of the fourth embodiment respectively generate a first control current ($I_{CCO1}$) and a second control current ($I_{CCO2}$) that are combined into the control current ($I_{CCO}$) for receipt by the current-controlled clock generator 4.

In the fourth embodiment, the second charge pump 12 has a function similar to that of the first charge pump 11. The second charge pump 12 is coupled to the phase detector 6 for receiving the first difference signal ($V_{D1}$) therefrom, further receives a second reference current ($I_{ref2}$), is further coupled to the output terminal 13, and provides a second pump current ($I_{CP2}$) at the output terminal 13 based on the first difference signal ($V_{D1}$) and the second reference current ($I_{ref2}$). It should be noted that a magnitude of the second reference current ($I_{ref2}$) is equal to the magnitude of the first reference current ($I_{ref1}$) in this embodiment, but may be different from the magnitude of the first reference current ($I_{ref1}$) in other embodiments.

The output terminal 20 is coupled to the output terminal 10. The first filter 21 includes the first resistive element ($R_Z$) and the second capacitive element ($C_P$) that are coupled in parallel between the output terminal 20 and ground, that cooperatively receive the first pump current ($I_{CP1}$) from the output terminal 10, and that cooperatively develop the first control voltage ($V_{C1}$) at the output terminal 20. The first resistive element ($R_Z$) has a resistance of the first resistance value. The output terminal 23 is coupled to the output terminal 13. The second filter 22 includes the first capacitive element ($C_Z$) that is coupled between the output terminal 23 and ground, that receives the second pump current ($I_{CP2}$) from the output terminal 13, and that develops the second control voltage ($V_{C2}$) at the output terminal 23.

The first voltage-to-current converter 34 is coupled to the output terminal 23 for receiving the second control voltage ($V_{C2}$) therefrom, is coupled further to the current-controlled clock generator 4 and the first charge pump 11, generates the first control current ($I_{CCO1}$), and generates the first reference current ($I_{ref1}$) for receipt by the first charge pump 11. The first voltage-to-current converter 34 includes a first transistor ($M_{21}$), a second resistive element ($K_{VT1}$) and a first current mirror 341. The first transistor ($M_{21}$) (e.g., an nMOSFET) has a drain terminal, a source terminal, and a gate terminal that is coupled to the output terminal 23 for receiving the second control voltage ($V_{C2}$) therefrom. The second resistive element ($K_{VT1}$) is coupled between the source terminal of the first transistor ($M_{21}$) and ground, and has a resistance of the second resistance value. The first current mirror 341 is coupled to the drain terminal of the first transistor ($M_{21}$), the current-controlled clock generator 4 and the first charge pump 11, and generates, based on a current flowing through the first transistor ($M_{21}$), the first control current ($I_{CCO1}$) and the first reference current ($I_{ref1}$) that is for receipt by the first charge pump 11. In an example, the first current mirror 341 includes a second transistor ($M_{22}$), a third transistor ($M_{23}$) and a fourth transistor ($M_{24}$), but the disclosure is not limited thereto. The configuration of the first current mirror 341 is the same as that of the current mirror 311 (see FIG. 2) of the first embodiment, and details thereof are omitted for the sake of brevity.

Similarly, the second voltage-to-current converter 35 is coupled to the output terminal 20 for receiving the first control voltage ($V_{C1}$) therefrom, is coupled further to a common node of the first voltage-to-current converter 34 and the current-controlled clock generator 4, and generates the second control current ($I_{CCO2}$) that is combined with the first control current ($I_{CCO1}$) into the control current ($I_{CCO}$) for receipt by the current-controlled clock generator 4. The second voltage-to-current converter 35 includes a fifth transistor ($M_{25}$), a third resistive element ($K_{VT2}$) and a second current mirror 351. The fifth transistor ($M_{25}$) (e.g., an nMOSFET) has a drain terminal, a source terminal, and a gate terminal that is coupled to the output terminal 20 for receiving the first control voltage ($V_{C1}$) therefrom. The third resistive element ($K_{VT2}$) is coupled between the source terminal of the fifth transistor ($M_{25}$) and ground. The second current mirror 351 is coupled to the drain terminal of the fifth transistor ($M_{25}$) and the common node of the first voltage-to-current converter 34 and the current-controlled clock generator 4, and generates the second control current ($I_{CCO2}$) based on a current flowing through the fifth transistor ($M_{25}$). In an example, the second current mirror 351 includes a sixth transistor ($M_{26}$) and a seventh transistor ($M_{27}$), but the disclosure is not limited thereto. The sixth transistor ($M_{26}$) (e.g., a pMOSFET) has a drain terminal that is coupled to the drain terminal of the fifth transistor ($M_{25}$), a source terminal that receives the supply voltage, and a gate terminal that is coupled to the drain terminal thereof. The seventh transistor ($M_{27}$) (e.g., a pMOSFET) has a drain terminal that is coupled to the common node of the first voltage-to-current converter 34 and the current-controlled clock generator 4 and that provides the second control current ($I_{CCO2}$), a source terminal that receives the supply voltage, and a gate terminal that is coupled to the gate terminal of the sixth transistor ($M_{26}$).

The current control clock generator 4 generates the output clock signal ($F_{OUT}$) based on the combination of the first and second control currents ($I_{CCO1}$, $I_{CCO2}$) (i.e., the control current ($I_{CCO}$)). In an example, the frequency of the output clock signal ($F_{OUT}$) is positively correlated to a sum of magnitudes of the first and second control currents ($I_{CCO1}$, $I_{CCO2}$)). In other words, greater sum of the magnitudes of the first and second control currents ($I_{CCO1}$, $I_{CCO2}$)) leads to higher frequency of the output clock signal ($F_{OUT}$).

The loop bandwidth of the PLL including the clock generator circuit 100 of this embodiment is the same as that of the PLL including the clock generator circuit 100 of the first embodiment. Therefore, according to Equation 1, as long as each of M and β is independent of the PVT variations of the clock generator circuit 100 of this embodiment and is constant, the bandwidth of the PLL and the frequency of the input clock signal ($F_{IN}$) are in a constant ratio to each other.

It should be noted that, since the magnitude of the second reference current ($I_{ref2}$) and a resistance of the third resistive element ($K_{VT2}$) are irrelevant to the loop bandwidth of the PLL, the second reference current ($I_{ref2}$) may be generated in the same way as the first reference current ($I_{ref1}$) or may be generated by one other bias circuit or bias current source, and the third resistive element ($K_{VT2}$) may be designed in the same way as the second resistive element ($K_{VT1}$) or may be designed in a different way from the second resistive element ($K_{VT1}$). Regardless how the second reference current ($I_{ref2}$) is generated, the magnitude of the second reference current ($I_{ref2}$) may be equal to the magnitude of the first reference current ($I_{ref1}$) as is in this embodiment, or may be different from the magnitude of the first reference current ($I_{ref1}$).

5th Embodiment

Figure 7:
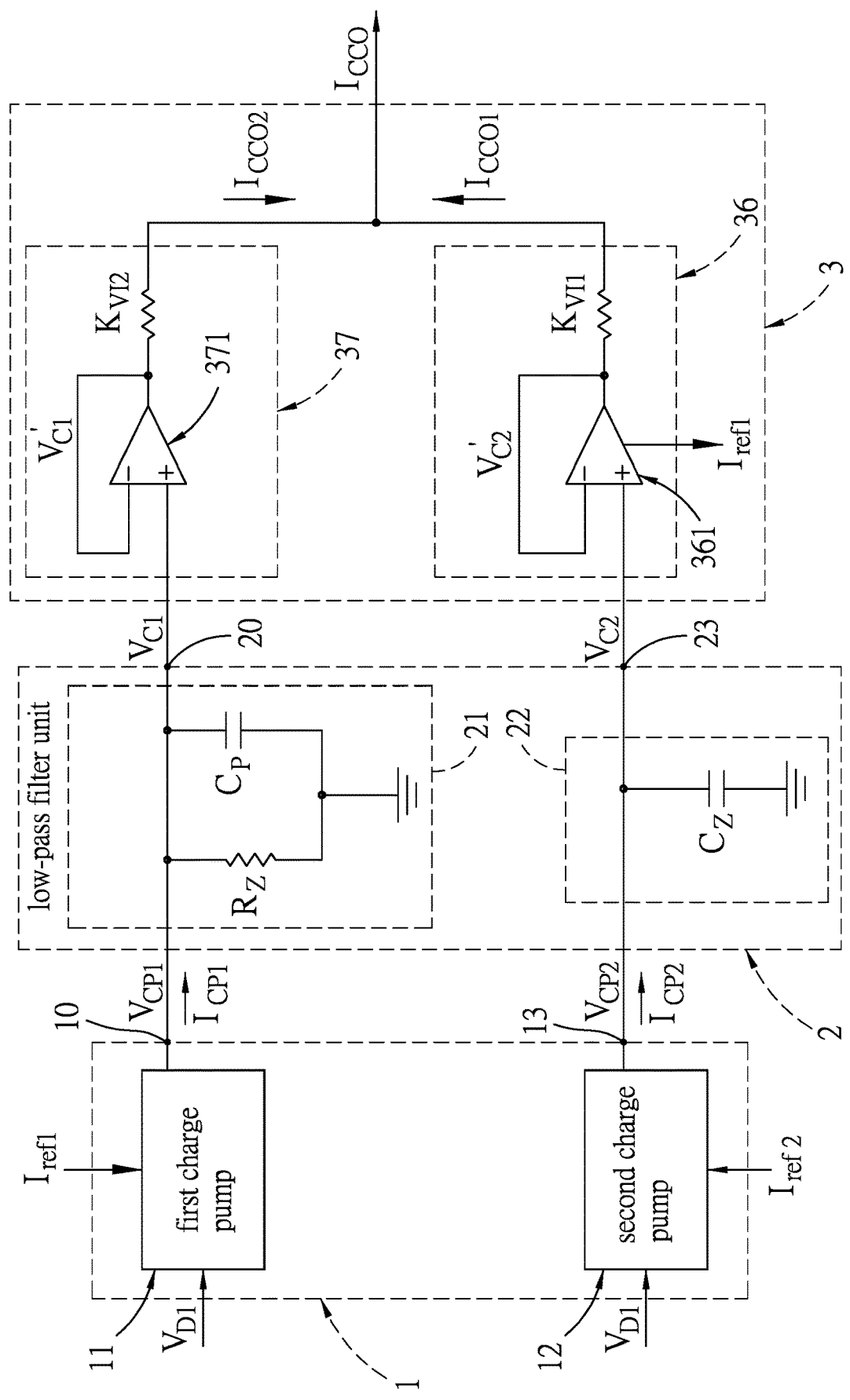
FIG. 7 is a circuit block diagram illustrating a fifth embodiment of the clock generator circuit according to the disclosure.

Referring to FIGS. 1 and 7, a fifth embodiment of the clock generator circuit 100 according to the disclosure is derived from the second and fourth embodiments. The charge pump unit 1 includes two charge pumps 11, 12 and two output terminals 10, 13, connections of which are the same as those of the fourth embodiment. The low-pass filter unit 2 includes two filters 21, 22 and two output terminals 20, 23, configurations and connections of which are the same as those of the fourth embodiment. The voltage-to-current converter unit 3 includes two voltage-to-current converters 36, 37, each of which has a configuration and connections similar to those of the first voltage-to-current converter 32 (see FIG. 3) of the second embodiment. Details of this embodiment are omitted for the sake of brevity.

6th Embodiment

Figure 8:
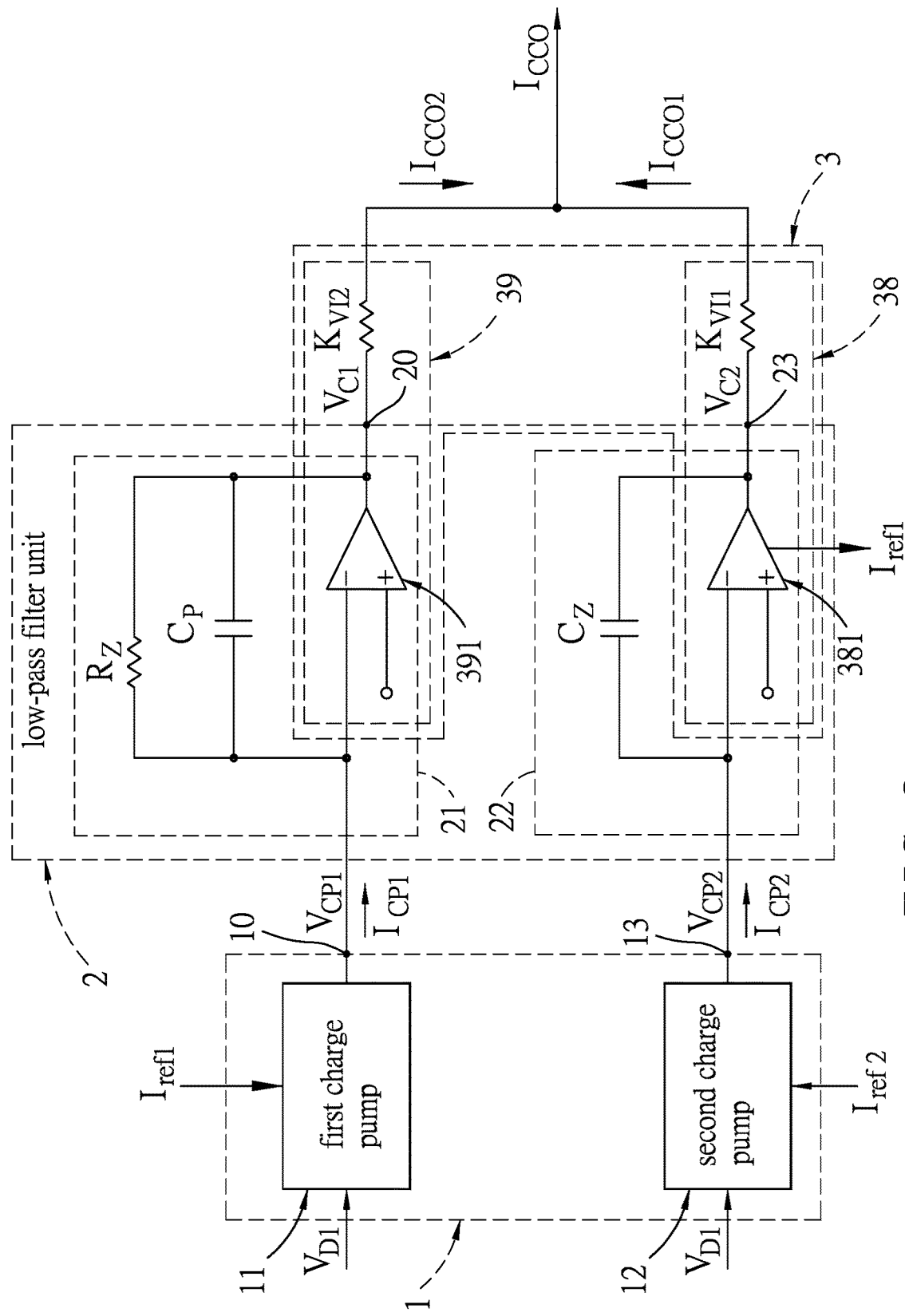
FIG. 8 is a circuit block diagram illustrating a sixth embodiment of the clock generator circuit according to the disclosure.

Referring to FIGS. 1 and 8, a sixth embodiment of the clock generator circuit 100 according to the disclosure is derived from the third and fourth embodiments. The charge pump unit 1 includes two charge pumps 11, 12 and two output terminals 10, 13, connections of which are the same as those of the fourth embodiment. The low-pass filter unit 2 includes two filters 21, 22 and two output terminals 20, 23, and each of the filters 21, 22 has a configuration similar to that of the first filter 21 (see FIG. 5) of the third embodiment. The voltage-to-current converter unit 3 includes two voltage-to-current converters 38, 39, each of which has a configuration the same as that of the first voltage-to-current converter 33 (see FIG. 5) of the third embodiment. Connections of each of the filters 21, 22 and a corresponding one of the voltage-to-current converters 38, 39 are similar to those of the first filter 21 and the first voltage-to-current converter 33 of the third embodiment (see FIG. 5). Details of this embodiment are omitted for the sake of brevity.

7th Embodiment

Figure 9:
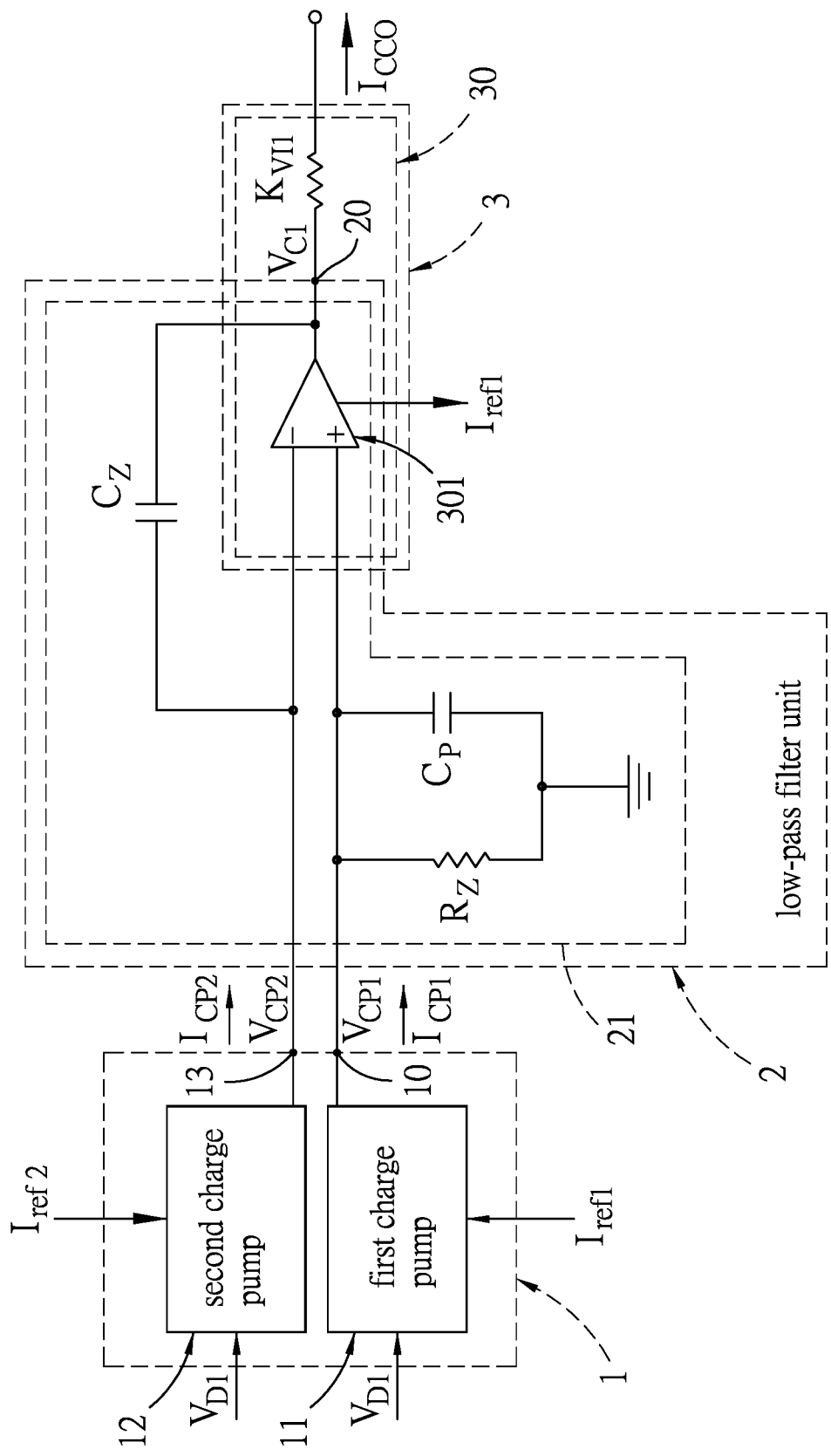
FIG. 9 is a circuit block diagram illustrating a seventh embodiment of the clock generator circuit according to the disclosure.

Referring to FIGS. 1 and 9, a seventh embodiment of the clock generator circuit 100 according to the disclosure is derived from the third and fourth embodiments. The charge pump unit 1 includes two charge pumps 11, 12 and two output terminals 10, 13, connections of which are the same as those of the fourth embodiment. The voltage-to-current converter unit 3 includes a first voltage-to-current converter 30, and the first voltage-to-current converter 30 includes a first operational amplifier 301 and a second resistive element ($K_{VT1}$) that are respectively the same as the first operational amplifier 331 and the second resistive element ($K_{VT1}$) of the third embodiment (see FIG. 5). The low-pass filter unit 2 includes a first filter 21 and an output terminal 20, and the first filter 21 cooperates with the first operational amplifier 301 to develop the first control voltage ($V_{C1}$) at the output terminal 20.

In the seventh embodiment, the first filter 21 includes a first capacitive element ($C_Z$), a first resistive element ($R_Z$) and a second capacitive element ($C_P$). The first capacitive element ($C_Z$) is coupled between the output terminals 13, 20, and receives the second pump current ($I_{CP2}$) from the output terminal 13. The first resistive element ($R_Z$) and the second capacitive element ($C_P$) are coupled in parallel between the output terminal 10 and ground, and cooperatively receive the first pump current ($I_{CP1}$) from the output terminal 10.

The first operational amplifier 301 has a non-inverting terminal that is coupled to the output terminal 10 for receiving the first output voltage ($V_{CP1}$) therefrom, an inverting terminal that is coupled to the output terminal 13 for receiving a second output voltage ($V_{CP2}$) therefrom, and an output terminal that is coupled to the output terminal 20.

The first operational amplifier 301 is further coupled to the first charge pump 11. The first operational amplifier 301 generates the control current ($I_{CCO}$) at the output terminal thereof, and generates the first reference current ($I_{ref1}$) for receipt by the first charge pump 11.

The second resistive element ($K_{VI1}$) is coupled between the output terminal of the first operational amplifier 301 and the current-controlled clock generator 4, and has a resistance of the second resistance value. The control current ($I_{CCO}$) flows to the current-controlled clock generator 4 through the second resistive element ($K_{VI1}$).

The loop bandwidth of the PLL including the clock generator circuit 100 of this embodiment is the same as that of the PLL including the clock generator circuit 100 of the first embodiment. Therefore, according to Equation 1, as long as each of M and β is independent of the PVT variations of the clock generator circuit 100 of this embodiment and is constant, the bandwidth of the PLL and the frequency of the input clock signal ($F_{IN}$) are in a constant ratio to each other.

Figure 10:
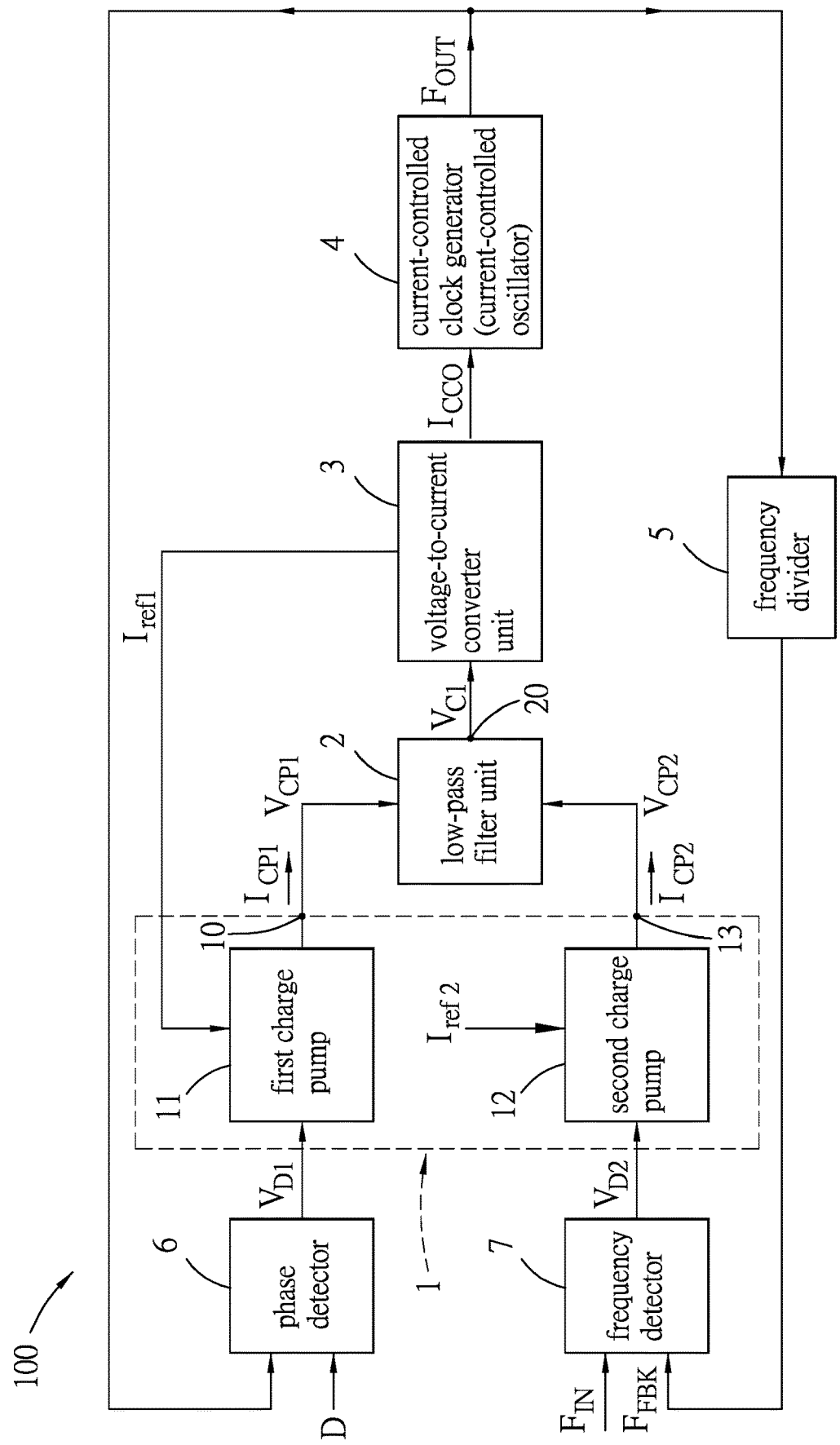
FIG. 10 is a block diagram illustrating a second use of the clock generator circuit according to the disclosure in a clock and data recovery device.

Referring to FIG. 10, the clock generator circuit 100 of each of the fourth to seventh embodiments may cooperate with a phase detector 6, a frequency detector 7 and a frequency divider 5 to form a clock and data recovery (CDR) device.

The phase detector 6 receives a data signal (D), is coupled to the current-controlled clock generator 4 for receiving the output clock signal ($F_{OUT}$) therefrom, and is further coupled to the first charge pump 11. The phase detector 6 compares a phase of the data signal (D) and a phase of the output clock signal ($F_{OUT}$) to generate, for receipt by the first charge pump 11, the first difference signal ($V_{D1}$) related to a phase difference between the data signal (D) and the output clock signal ($F_{OUT}$). The frequency divider 5 is coupled to the current-controlled clock generator 4 for receiving the output clock signal ($F_{OUT}$) therefrom, and divides the frequency of the output clock signal ($F_{OUT}$) to generate a divided clock signal ($F_{FBK}$). The frequency detector 7 receives an input clock signal ($F_{IN}$), is coupled to the frequency divider 5 for receiving the divided clock signal ($F_{FBK}$) therefrom, and is further coupled to the second charge pump 12. The frequency detector 7 compares a frequency of the input clock signal ($F_{IN}$) and a frequency of the divided clock signal ($F_{FBK}$) to generate, for receipt by the second charge pump 12, a second difference signal ($V_{D2}$) related to a frequency difference between the input clock signal ($F_{IN}$) and the divided clock signal ($F_{FBK}$).

A loop bandwidth of the CDR device is the same as that of the PLL including the clock generator circuit 100 (see FIG. 1) of the first embodiment. Therefore, according to Equation 1, as long as each of M and β is independent of the PVT variations of the clock generator circuit 100 of each of the fourth to seventh embodiments and is constant, the bandwidth of the CDR device and the frequency of the input clock signal ($F_{IN}$) are in a constant ratio to each other.

Figure 11:
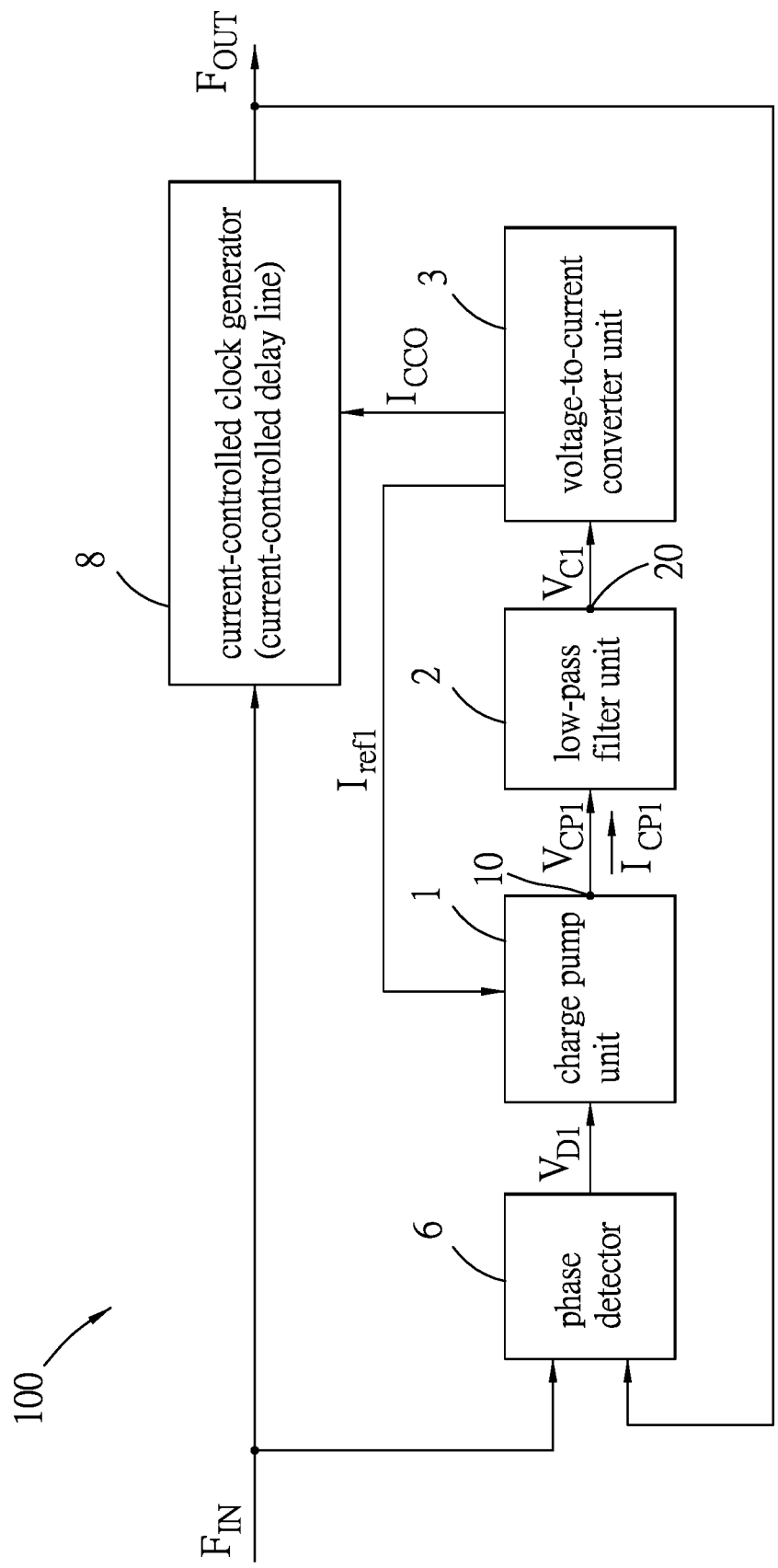
FIG. 11 is a block diagram illustrating a third use of the clock generator circuit according to the disclosure in a delay-locked loop.

Referring to FIG. 11, each of the first to seventh embodiments may be modified such that the current-controlled clock generator 8 is a current-controlled delay line, instead of the current-controlled oscillator. In addition, the clock generator circuit 100 of each modified embodiment may cooperate with a phase detector 6 to form a delay-locked loop (DLL).

The current-controlled clock generator 8 receives an input clock signal ($F_{IN}$), is coupled to the voltage-to-current converter unit 3 for receiving the control current ($I_{CCO}$) therefrom, and generates the output clock signal ($F_{OUT}$) based on the input clock signal ($F_{IN}$) and the control current ($I_{CCO}$). The phase detector 6 receives the input clock signal ($F_{IN}$), is coupled to the current-controlled clock generator 8 for receiving the output clock signal ($F_{OUT}$) therefrom, and is further coupled to the charge pump unit 1. The phase detector 6 compares a phase of the input clock signal ($F_{IN}$) and a phase of the output clock signal ($F_{OUT}$) to generate, for receipt by the charge pump unit 1, the first difference signal ($V_{D1}$) related to a phase difference between the input clock signal ($F_{IN}$) and the output clock signal ($F_{OUT}$).

A loop bandwidth of the DLL is the same as that of the PLL including the clock generator circuit 100 (see FIG. 1) of the first embodiment. Therefore, according to Equation 1, as long as each of M and β is independent of the PVT variations of the clock generator circuit 100 of each modified embodiment and is constant, the bandwidth of the DLL and the frequency of the input clock signal ($F_{IN}$) are in a constant ratio to each other.

Figure 12:
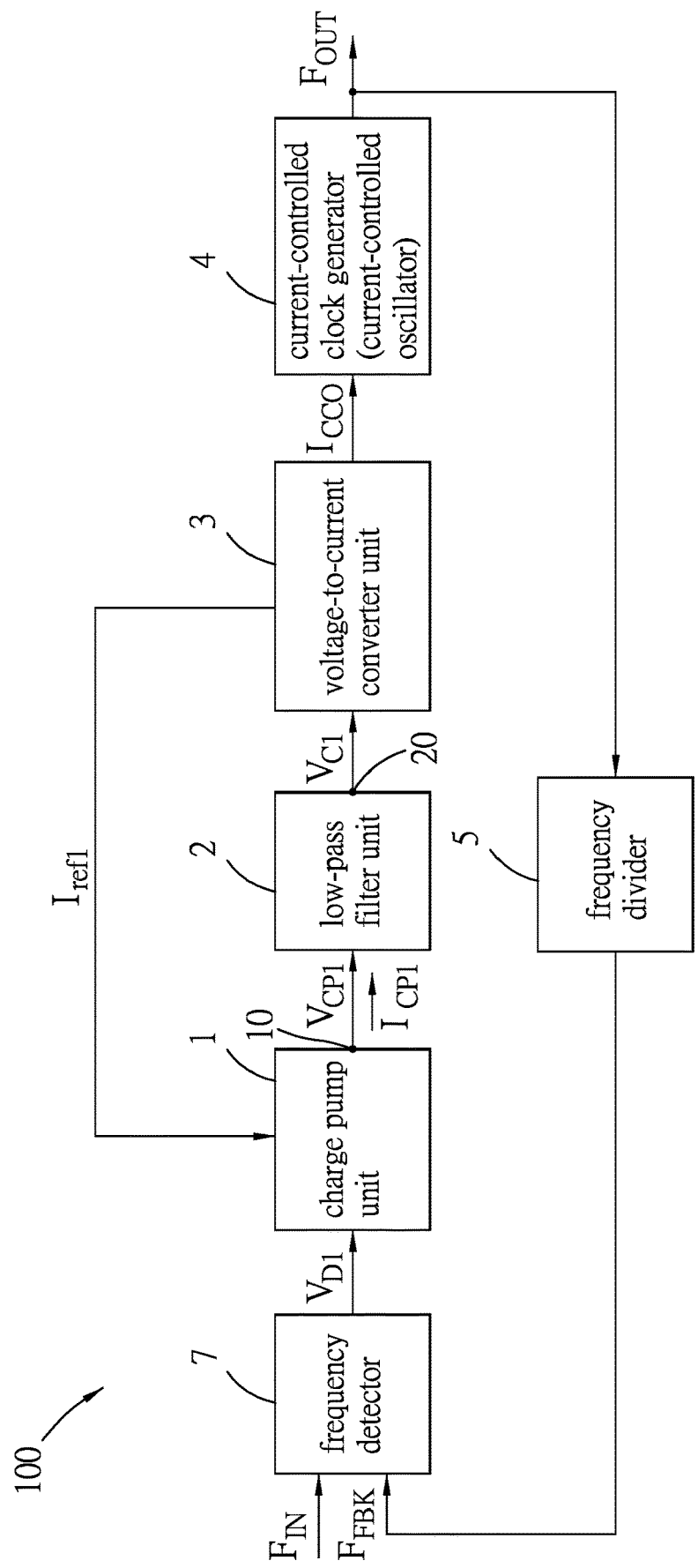
FIG. 12 is a block diagram illustrating a fourth use of the clock generator circuit according to the disclosure in a frequency-locked loop.

Referring to FIG. 12, the clock generator circuit 100 of each of the first to seventh embodiments may cooperate with a frequency detector 7 and a frequency divider 5 to form a frequency-locked loop (FLL).

The frequency divider 5 is coupled to the current-controlled clock generator 4 for receiving the output clock signal ($F_{OUT}$) therefrom, and divides the frequency of the output clock signal ($F_{OUT}$) to generate a divided clock signal ($F_{FBK}$). The frequency detector 7 receives an input clock signal ($F_{IN}$), is coupled to the frequency divider 5 for receiving the divided clock signal ($F_{FBK}$) therefrom, and is further coupled to the charge pump unit 1. The frequency detector 7 compares a frequency of the input clock signal ($F_{IN}$) and a frequency of the divided clock signal ($F_{FBK}$) to generate, for receipt by the charge pump unit 1, the first difference signal ($V_{D1}$) related to a frequency difference between the input clock signal ($F_{IN}$) and the divided clock signal ($F_{FBK}$).

A loop bandwidth of the FLL is the same as that of the PLL including the clock generator circuit 100 (see FIG. 1) of the first embodiment. Therefore, according to Equation 1, as long as each of M and β is independent of the PVT variations of the clock generator circuit 100 of each of the first to seventh embodiments and is constant, the bandwidth of the FLL and the frequency of the input clock signal ($F_{IN}$) are in a constant ratio to each other.

Figure 13:
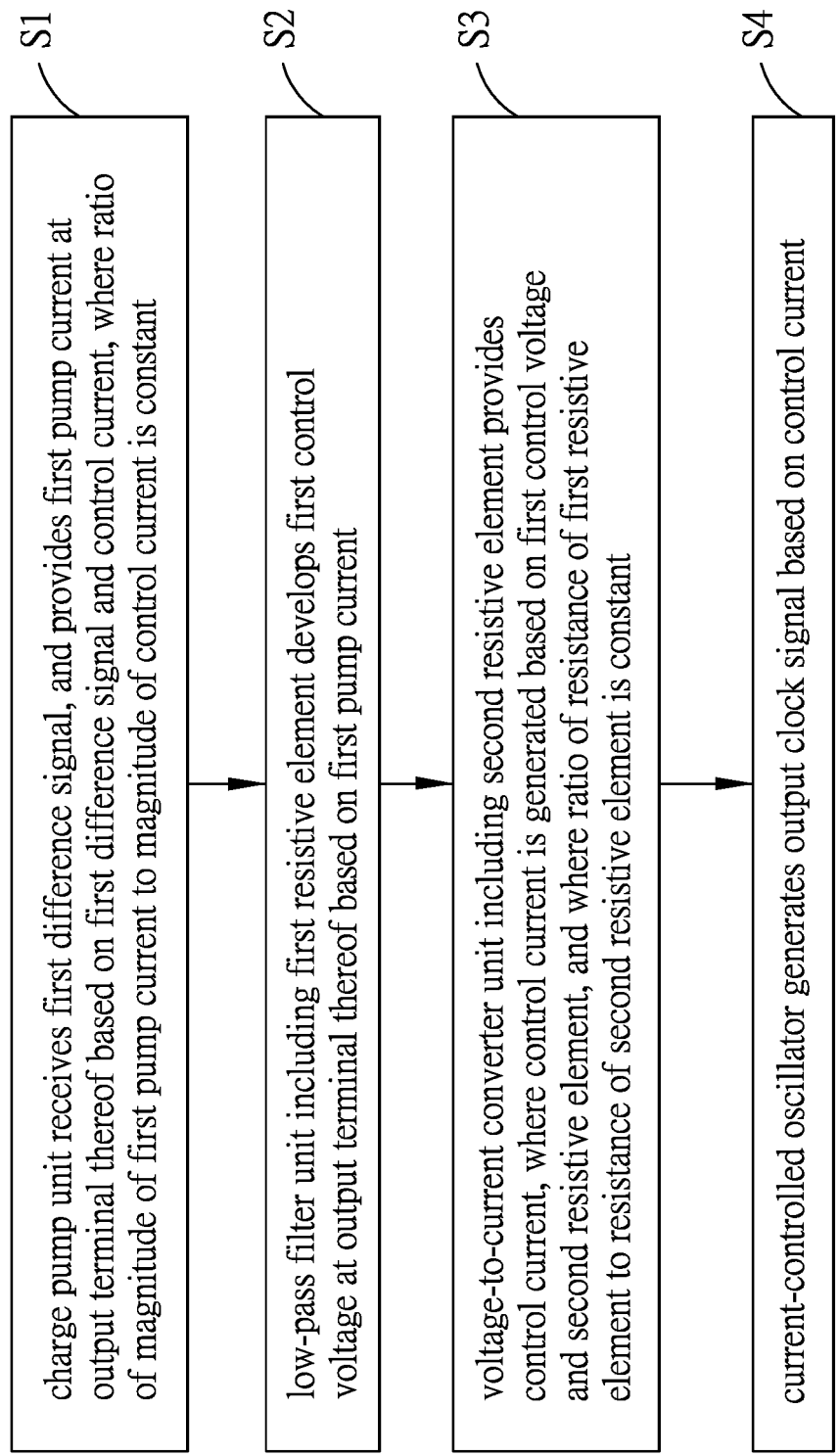
FIG. 13 is a flow chart illustrating a clock generating method according to the disclosure.

Referring to FIGS. 1 and 13, a clock generating method performed by the clock generator circuit 100 of each of the first to seventh embodiments includes the following steps (S1-S4).

In step (S1), the charge pump unit 1 receives the first difference signal ($V_{D1}$), and provides the first pump current ($I_{CP1}$) at the output terminal 10 thereof based on the first difference signal ($V_{D1}$) and the control current ($I_{CCO}$), where the ratio of the magnitude of the first pump current ($I_{CP1}$) to the magnitude of the control current ($I_{CCO}$) is constant.

In step (S2), the low-pass filter unit 2 including the first resistive element ($R_Z$) receives the first pump current ($I_{CP1}$), and develops the first control voltage ($V_{C1}$) at the output terminal 20 thereof based on the first pump current ($I_{CP1}$).

In step (S3), the voltage-to-current converter unit 3 including the second resistive element ($K_{VI1}$) receives the first control voltage ($V_{C1}$) and provides the control current ($I_{CCO}$), where the control current ($I_{CCO}$) is generated based on the first control voltage ($V_{C1}$) and the second resistive element ($K_{VI1}$), and where the ratio of the resistance of the first resistive element ($R_Z$) to the resistance of the second resistive element ($K_{VI1}$) is constant.

In step (S4), the current-controlled clock generator 4 receives the control current ($I_{CCO}$), and generates the output clock signal ($F_{OUT}$) based on the control current ($I_{CCO}$).

In each of the first to seventh embodiments, each of the resistive elements ($R_Z$, $K_{VT1}$, $K_{VT2}$) may be an active one or a passive one, and the first and second resistive elements ($R_Z$, $K_{VT1}$) are of the same type so that a ratio of their resistances can be independent of the PVT variations of the clock generator circuit 100. The active resistive element may be implemented using a transistor (e.g., a MOSFET) with its drain and gate terminals coupled to each other, using a transistor (e.g., a MOSFET) with it gate terminal receiving a predetermined bias voltage, or using an operational amplifier configured to be a unity gain buffer, etc. The passive resistive element may be a poly resistor, an N-well resistor or the like.

Moreover, in the second, third and fifth through seventh embodiments, in place of each operational amplifier, an amplifier having a type other than the operational amplifier may be used.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that the disclosure is not limited to the disclosed embodiments but is intended to cover various arrangements included within the spirit and scope of the broadest interpretation so as to encompass all such modifications and equivalent arrangements.

What is claimed is:

1. A clock generator circuit comprising:
    a charge pump unit providing a pump current at an output terminal thereof;
    a low-pass filter unit coupled to the output terminal of the charge pump unit, and developing a control voltage at an output terminal thereof based on the pump current;
    a current-controlled clock generator; and
    a voltage-to-current converter unit coupled to the output terminal of the low-pass filter unit, the current-controlled clock generator and the charge pump unit, and providing a control current to the current-controlled clock generator;
    wherein the low-pass filter unit includes a first resistive element, and the voltage-to-current converter unit includes a second resistive element;
    wherein the voltage-to-current converter unit further provides a reference current to the charge pump unit.

2. The clock generator circuit of claim 1, wherein the control current is determined based on the control voltage and the second resistive element.

3. The clock generator circuit of claim 1, wherein a ratio of the reference current to the control current is constant.

4. The clock generator circuit of claim 1, wherein a ratio of the first resistive element to the second resistive element is constant.

5. The clock generator circuit of claim 1, wherein a ratio of the pump current to the reference current is constant.

6. The clock generator circuit of claim 1, wherein:
    the charge pump unit receives a difference signal, and generates the pump current based on the difference signal and the reference current, and a ratio of the pump current to the reference current is constant;
    each of the first and second resistive elements has a resistance that is connected with a loop bandwidth related to the clock generator circuit, a ratio of the first resistive element to the second resistive element is constant;
    the voltage-to-current converter unit generates the control current and the reference current based on the control voltage and the second resistive element, and a ratio of the reference current to the control current is constant;
    the current-controlled clock generator generates an output clock signal based on the control current.

7. A clock generating method to be implemented by a clock generator circuit that includes a charge pump unit, a low-pass filter unit, a voltage-to-current converter unit and a current-controlled clock generator, the low-pass filter unit being coupled to an output terminal of the charge pump unit, and including a first resistive element, the voltage-to-current converter unit being coupled to the charge pump unit and an output terminal of the low-pass filter unit, and including a second resistive element, the current-controlled clock generator being coupled to the voltage-to-current converter unit, the clock generating method comprising:
    by the charge pump unit, receiving a difference signal, and providing a pump current at the output terminal thereof;
    developing, by the low-pass filter unit, a control voltage at the output terminal thereof based on the pump current;
    providing a control current by the voltage-to-current converter unit; and
    providing, by the voltage-to-current converter, a reference current to the charge pump unit.

8. The clock generating method of claim 7, wherein the control current is generated based on the control voltage and the second resistive element.

9. The clock generating method of claim 7, wherein a ratio of the first resistive element to the second resistive element is constant.

10. The clock generating method of claim 7, wherein a ratio of the pump current to the control current is constant.

11. The clock generating method of claim 7, wherein:
    the pump current is generated based on the difference signal;
    a ratio of the pump current to the control current is constant;
    each of the first and second resistive elements has a resistance that is connected with a loop bandwidth related to the clock generator circuit;
    a ratio of the first resistive element to the second resistive element is constant;
    the control current is generated based on the control voltage and the second resistive element.

12. The clock generating method of claim 7, further comprising: generating, by the current-controlled clock generator, an output clock signal based on the control current.

* * * * *